(12) United States Patent
Nagayasu

(10) Patent No.: US 11,085,956 B2
(45) Date of Patent: Aug. 10, 2021

(54) CAPACITOR CAPACITANCE MEASUREMENT DEVICE AND POWER APPARATUS

(71) Applicant: Mitsubishi Electric Corporation, Tokyo (JP)

(72) Inventor: Ryo Nagayasu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/628,874

(22) PCT Filed: Nov. 29, 2017

(86) PCT No.: PCT/JP2017/042784
§ 371 (c)(1),
(2) Date: Jan. 6, 2020

(87) PCT Pub. No.: WO2019/043963
PCT Pub. Date: Mar. 7, 2019

(65) Prior Publication Data
US 2020/0225268 A1    Jul. 16, 2020

(30) Foreign Application Priority Data
Aug. 30, 2017 (WO) .................. PCT/JP2017/031160

(51) Int. Cl.
*G01R 27/26* (2006.01)
*G01R 31/64* (2020.01)
*H01H 33/666* (2006.01)

(52) U.S. Cl.
CPC ......... *G01R 27/2605* (2013.01); *G01R 31/64* (2020.01); *H01H 33/6662* (2013.01)

(58) Field of Classification Search
CPC ........ G01R 27/00; G01R 27/02; G01R 27/26; G01R 27/2605; G01R 31/00; G01R 31/50;
(Continued)

(56) References Cited

U.S. PATENT DOCUMENTS

| 6,205,039 B1 * | 3/2001 | .ANG.strom | .......... G01R 31/40 363/50 |
| 8,362,784 B2 * | 1/2013 | Takeuchi | ................. H01G 9/14 324/548 |

(Continued)

FOREIGN PATENT DOCUMENTS

JP    2013068495 A    4/2013

OTHER PUBLICATIONS

International Search Report (PCT/ISA/210) dated Feb. 20, 2018, by the Japanese Patent Office as the International Searching Authority for International Application No. PCT/JP2017/042784.
(Continued)

*Primary Examiner* — Hoai-An D. Nguyen
(74) *Attorney, Agent, or Firm* — Buchanan Ingersoll & Rooney PC

(57) ABSTRACT

A capacitor capacitance measurement device includes a discharge circuit which is connected in parallel to a charging circuit and a capacitor and in which a discharge switch and a discharge resistor are connected in series, a resistor voltage dividing circuit which is connected in parallel to the capacitor and in which a first resistor and a second resistor are connected in series, and a control device for sending a command to stop charging of the capacitor to the charging circuit, sending a conduction command to the discharge switch, measuring a voltage $V_a$ at a voltage division point of the resistor voltage dividing circuit, and calculating a capacitance of the capacitor from a drop in the voltage of the
(Continued)

capacitor during discharge. On the basis of whether a time difference in the capacitor voltage drop is within a threshold, correct/false determination for capacitor capacitance measurement is performed.

14 Claims, 9 Drawing Sheets

(58) Field of Classification Search
CPC .... G01R 31/64; G01R 19/00; G01R 19/0084; G01R 19/0092; G01R 15/00; G01R 15/04; G01R 15/14; G01R 15/16; H01H 33/00; H01H 33/60; H01H 33/66; H01H 33/666; H01H 33/6662; G01D 5/00; G01D 5/12; G01D 5/14; G01D 5/24
USPC ....... 324/600, 649, 658, 659, 678, 679, 686, 324/691, 713, 76.11, 98, 522; 702/1, 57, 702/60, 63, 64
See application file for complete search history.

(56) References Cited

U.S. PATENT DOCUMENTS

| | | | |
|---|---|---|---|
| 10,620,247 B2* | 4/2020 | Ou Yang | H02M 1/42 |
| 2011/0133757 A1* | 6/2011 | Chae | G01R 31/64 |
| | | | 324/678 |
| 2013/0245869 A1* | 9/2013 | Nishida | B60L 15/20 |
| | | | 701/22 |
| 2017/0085174 A1* | 3/2017 | Babazadeh | H02M 3/158 |

OTHER PUBLICATIONS

Written Opinion (PCT/ISA/237) dated Feb. 20, 2018, by the Japanese Patent Office as the International Searching Authority for International Application No. PCT/JP2017/042784.

* cited by examiner

CAPACITOR CAPACITANCE MEASUREMENT DEVICE AND POWER APPARATUS

TECHNICAL FIELD

The present invention relates to a capacitor capacitance measurement device for measuring the capacitance of a capacitor in a state where energy is stored in the capacitor, and a power apparatus including the capacitor capacitance measurement device.

BACKGROUND ART

A power apparatus used in a power transmission system is required to have reliability over a long period of time. For example, in a circuit breaker having an electromagnetic operation mechanism, electromagnetic force is generated by energizing a coil with energy stored in a capacitor through charging, and the circuit breaker is operated by the electromagnetic force. Since the energy needed to operate the circuit breaker depends on the energy stored in the capacitor, if the capacitance of the capacitor drops, the energy needed for operation cannot be supplied, so that the circuit breaker cannot be normally operated. Therefore, periodical measurement of the capacitor capacitance is essential. However, in order to check the capacitance of the capacitor with an LCR meter or the like, it is necessary to stop the power apparatus. If the capacitance of the capacitor can be measured in a state where energy is stored in the capacitor and with little effect on the energy stored in the capacitor, reliability of the power apparatus can be expected to be ensured without stopping the power apparatus. By detecting the capacitance of the capacitor before the capacitance of the capacitor becomes less than the needed energy, planned replacement of the capacitor is allowed to be carried out, leading to stable operation of the power apparatus.

In response to this problem, the applicant has proposed a capacitor capacitance measurement device disclosed in Patent Document 1, thereby achieving provision of a capacitor capacitance measurement device capable of periodically measuring the capacitance of a capacitor, even in a state where an electromagnetic operation mechanism of a power apparatus in operation is driven by the capacitor, without hindering the driving.

CITATION LIST

Patent Document

Patent Document 1: Japanese Laid-Open Patent Publication No. 2013-68495

SUMMARY OF THE INVENTION

Problems to be Solved by the Invention

With the capacitor capacitance measurement device, it is possible to measure the capacitance of a capacitor while the capacitor is used, by discharging the capacitor for a predetermined time to reduce a voltage drop value to be within a predetermined value when measuring the capacitance of the capacitor. In addition, use of the capacitor capacitance measurement device in measurement of the capacitance of a capacitor used in an electromagnetic operation mechanism of a power apparatus allows the capacitance of the capacitor to be periodically measured during operation of the power apparatus.

However, in recent years, capacitor capacitance measurement is required to have high accuracy even if the capacitor voltage or the voltage in a capacitor voltage measuring circuit temporarily fluctuates due to poor contact in wiring connection, surge, or the like. Moreover, if the accuracy of a measurement result improves, the accuracy of quality determination for a capacitor also improves, so that unnecessary replacement of the capacitor is eliminated and optimization of replacement time for the capacitor can be expected.

The present invention has been made to solve the above problem, and an object of the present invention is to, even if a capacitor voltage temporarily fluctuates due to, for example, poor contact in wiring connection, surge, or the like at timing of capacitor capacitance measurement, enable correct/false determination for capacitor capacitance measurement itself in consideration of the fluctuations. A further object of the present invention is to achieve capacitor capacitance measurement with high accuracy, carry out discarding a capacitor with an insufficient capacitance, etc., and assuredly determine capacitor replacement time.

Solution to the Problems

A capacitor capacitance measurement device according to the present invention includes: a discharge circuit connected in parallel to a capacitor and configured by a discharge resistor and a discharge switch connected in series; a resistor voltage dividing circuit connected in parallel to the capacitor and configured by a first resistor and a second resistor connected in series; and a control device for discharging energy stored in the capacitor, by stopping charging of the capacitor and conducting the discharge switch, measuring a voltage at a voltage division point of the resistor voltage dividing circuit, and calculating a capacitor capacitance from the voltage at the voltage division point. The capacitor is discharged for a predetermined time within a time taken until a voltage value of the capacitor which drops due to discharge of the energy stored in the capacitor reaches a predetermined value. A capacitor voltage calculated from the voltage, at the voltage division point of the resistor voltage dividing circuit, measured within the predetermined time is set as a measurement capacitor voltage. A difference in the measurement capacitor voltage between measurement times within the predetermined time is compared with a preset threshold, and it is determined whether a value of the capacitor capacitance calculated by the control device is correct.

A power apparatus according to the present invention includes: the capacitor capacitance measurement device having a function of correct/false determination for the value of the calculated capacitor capacitance; and an electromagnetic operation mechanism operated by the energy stored in the capacitor.

Effect of the Invention

According to the present invention, since the capacitor capacitance measurement device having a function of correct/false determination for the value of the calculated capacitor capacitance is included, when a disturbance such as noise occurs during capacitor capacitance measurement, it can be determined whether the value of the calculated capacitor capacitance is correct. That is, even when the capacitor voltage temporarily fluctuates, determination as to whether the capacitor capacitance measurement itself is correct or false is enabled in consideration of the fluctuations, so that capacitor capacitance measurement with high accuracy can be achieved.

DESCRIPTION OF EMBODIMENTS

Figure 1:
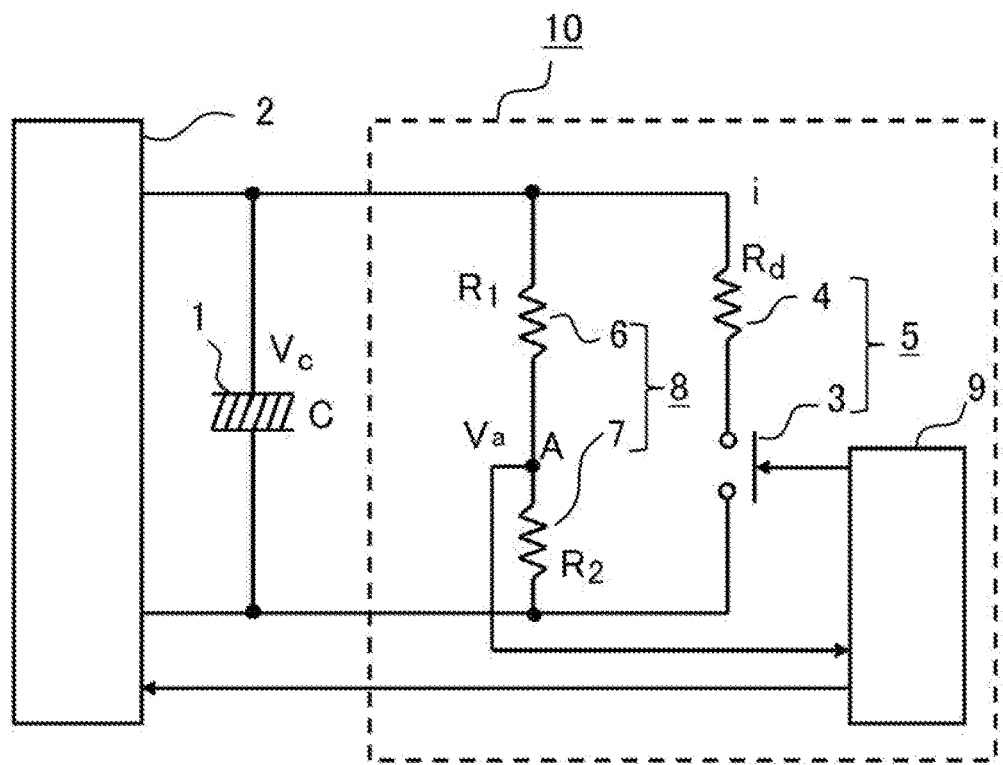
FIG. 1 is a configuration diagram of a capacitor capacitance measurement device according to Embodiment 1 of the present invention.

Hereinafter, a capacitor capacitance measurement device having a correct/false determination function and a power apparatus including the capacitor capacitance measurement device, according to embodiments of the present invention, will be described with reference to the drawings.

In the drawings, the same reference characters denote the same or corresponding parts.

Embodiment 1

Figure 2:
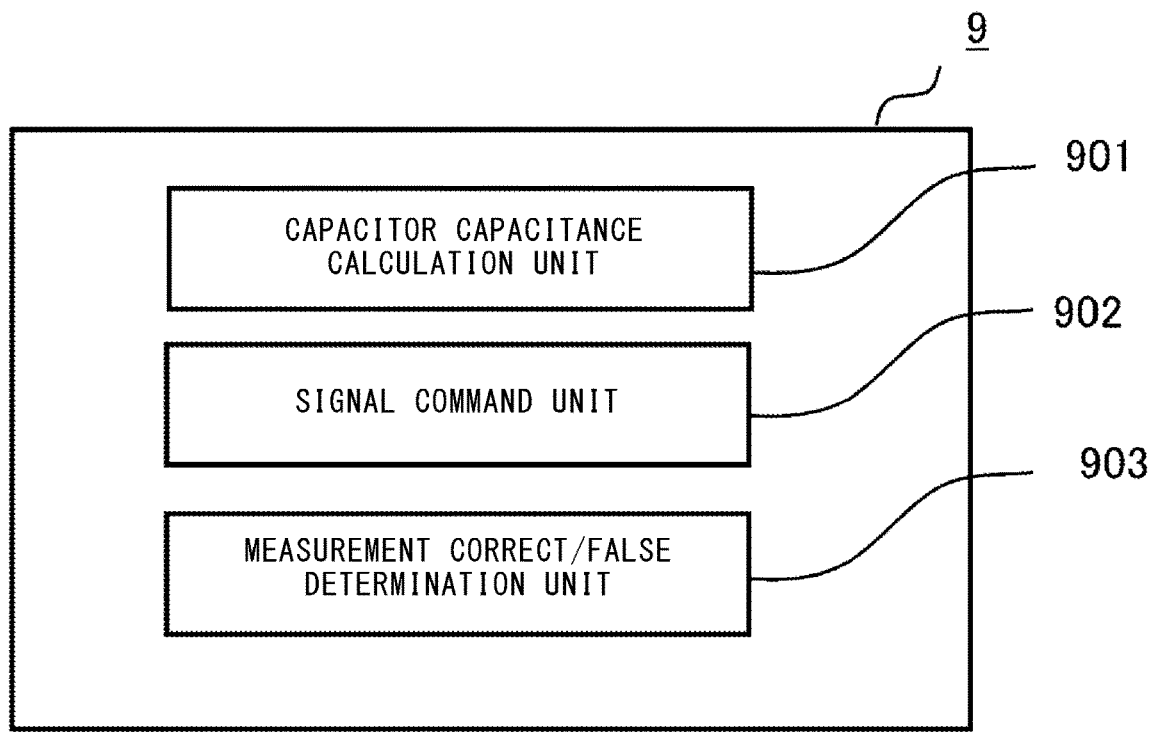
FIG. 2 is a block diagram illustrating the function of a control device in FIG. 1.
Figure 3:
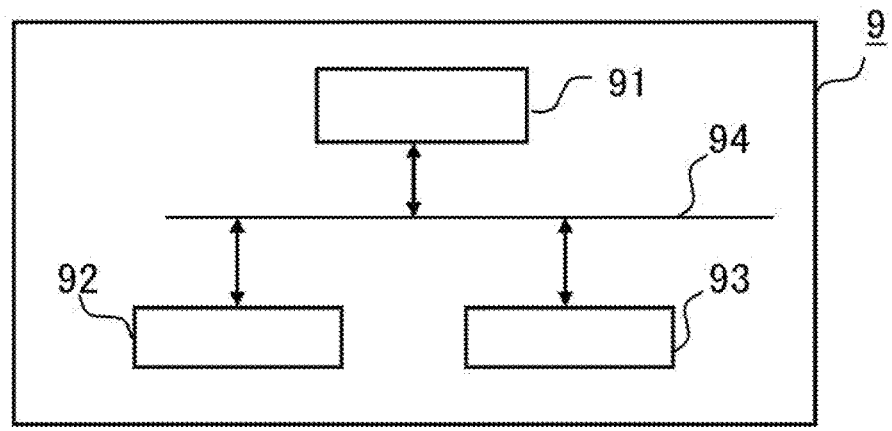
FIG. 3 is a hardware configuration diagram of the control device in FIG. 1.
Figure 4:
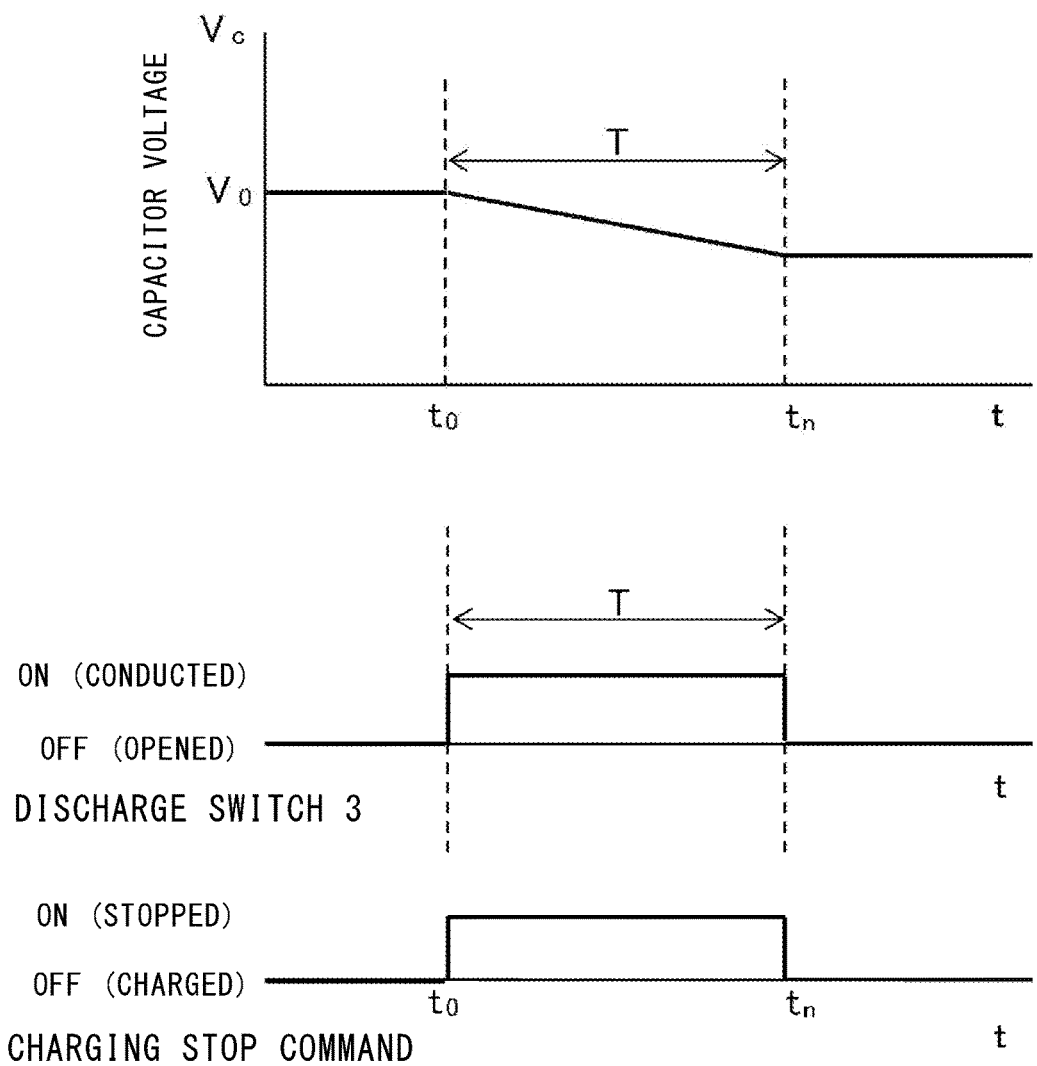
FIG. 4 is a diagram showing change in a voltage due to discharge of a capacitor in the capacitor capacitance measurement device according to Embodiment 1 of the present invention.
Figure 5:
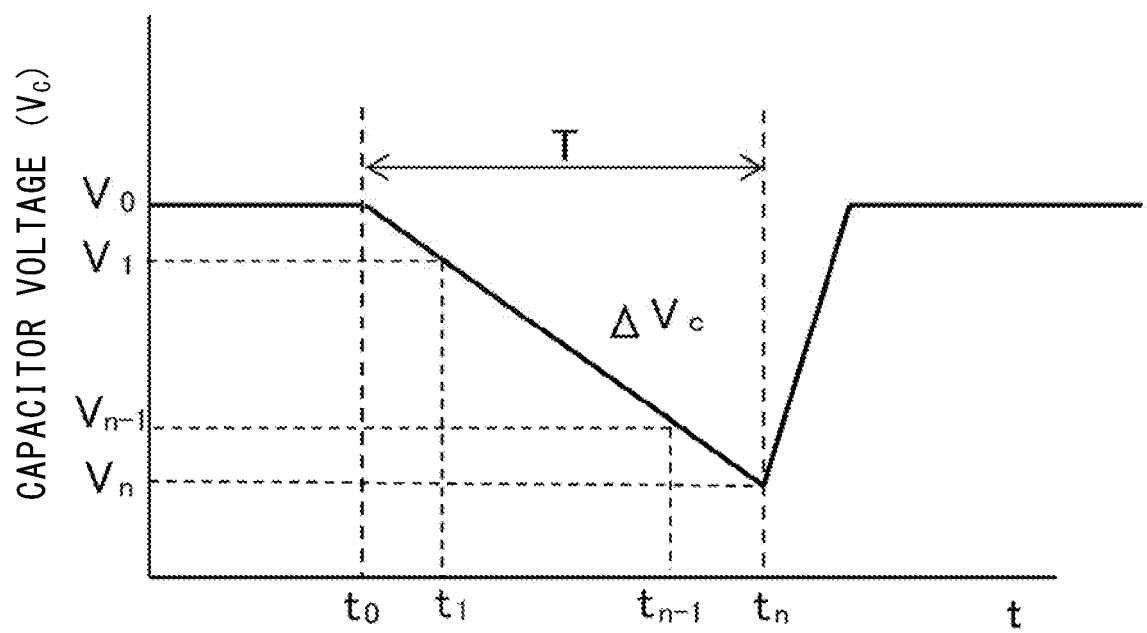
FIG. 5 illustrates a method for obtaining the capacitance of the capacitor in the capacitor capacitance measurement device according to Embodiment 1 of the present invention.
Figure 6A:
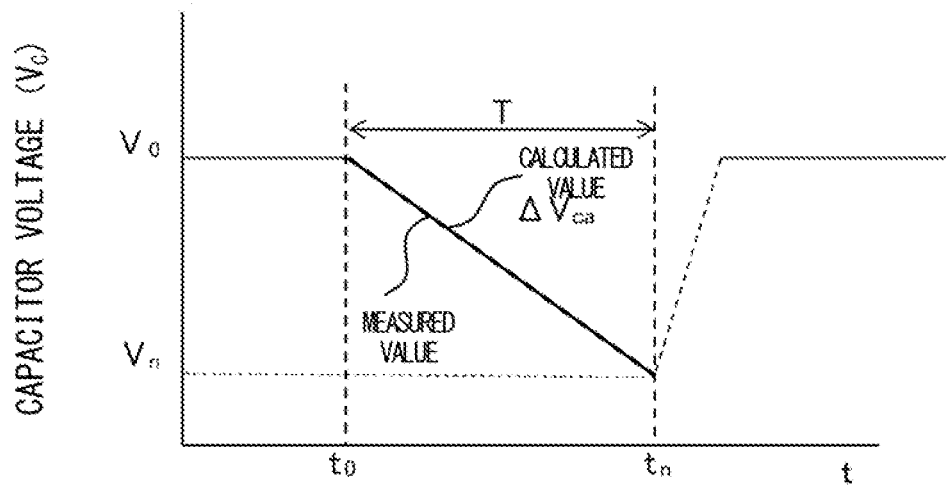
FIGS. 6A to 6C illustrate a state where a capacitor voltage fluctuates when an abnormality such as poor contact and surge occurs in FIG. 5.
Figure 6B:
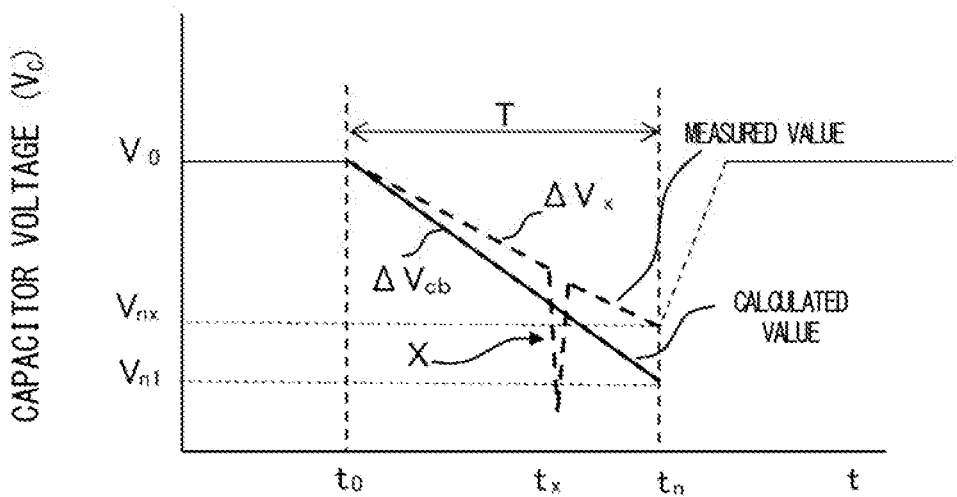
Figure 6C:
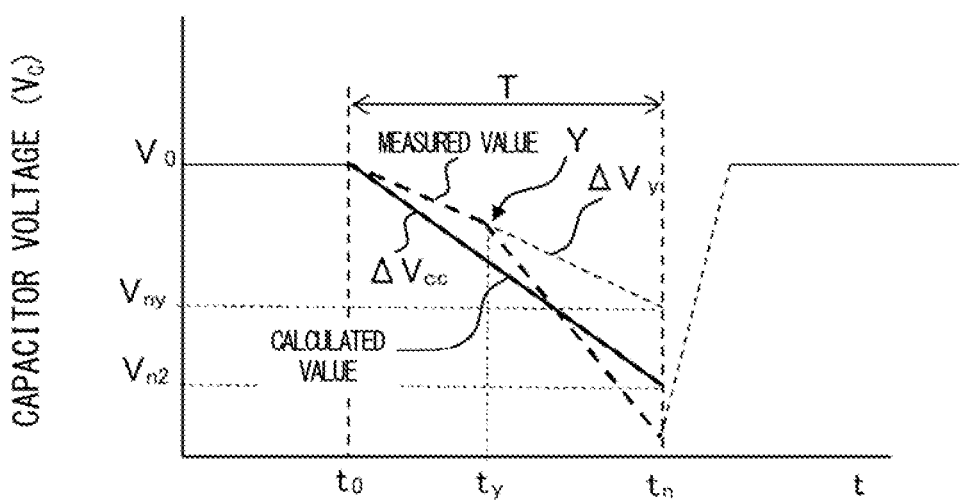

FIG. 1 is a circuit configuration diagram schematically showing a capacitor capacitance measurement device according to Embodiment 1 of the present invention. FIG. 2 is a block diagram illustrating the function of a control device of the capacitor capacitance measurement device according to Embodiment 1 of the present invention. FIG. 3 is a diagram showing the hardware configuration of the control device. FIG. 4 is a diagram showing a change in voltage due to discharge of a capacitor in the capacitor capacitance measurement device. FIG. 5 illustrates a method for obtaining the capacitance of the capacitor in the capacitor capacitance measurement device. In addition, FIGS. 6A to 6C illustrate a state where the capacitor voltage fluctuates due to occurrence of an abnormality such as poor contact or surge in FIG. 5.

In FIG. 1, the capacitor capacitance measurement device 10 is connected to a capacitor 1 and a charging circuit 2 which charges the capacitor 1. The capacitor capacitance measurement device 10 includes a discharge circuit 5 which is connected in parallel to the capacitor 1 and in which a discharge switch 3 for discharging charged energy of the capacitor 1 and a discharge resistor 4 are connected in series, a resistor voltage dividing circuit 8 which is connected in parallel to the capacitor 1 and in which a first resistor 6 and a second resistor 7 for measuring a capacitor voltage drop value during discharge are connected in series, and a control device 9 which sends a command to stop charging of the capacitor 1 to the charging circuit 2 and sends a conduction command to the discharge switch 3 of the discharge circuit 5, which measures a voltage $V_a$ at a voltage division point A of the resistor voltage dividing circuit 8, and which calculates the capacitance of the capacitor 1.

The control device 9 includes a capacitor capacitance calculation unit 901 which calculates a capacitor capacitance, a signal command unit 902 which sends signals such as a command to stop charging of the capacitor 1 to the charging circuit 2 and a conduction command to the discharge switch 3 of the discharge circuit 5, and a measurement correct/false determination unit 903 which determines whether the calculated capacitor capacitance is correct and which will be described in detail later.

Moreover, the function of the control device 9 is implemented by hardware shown in FIG. 3. Specifically, a processor 91, a memory 92 in which data and programs to be executed by the processor 91 are stored, and an input/output device 93 are connected to each other by a data bus 94. Under control by the processor 91, transmission of a command signal to stop charging of the capacitor 1 to the charging circuit 2, data processing and data transmission for calculation of the capacitance of the capacitor 1, etc., are performed.

[Capacitor Capacitance Measurement: Steady Operation]

Next, the principle of operation of the capacitor capacitance measurement device 10 in Embodiment 1 will be described with reference to FIG. 1, FIG. 4, and FIG. 5. The capacitor 1 to be measured is always charged to a rated voltage thereof by the charging circuit 2. To monitor a change in the capacitance of the capacitor 1, the energy stored in the capacitor 1 is periodically discharged instantly. First, as a command from the control device 9, a command to stop charging of the capacitor 1 is sent to the charging circuit 2 at time t0, and a conduction command is sent to the discharge switch 3 of the discharge circuit 5 at the same time. Accordingly, the energy stored in the capacitor 1 flows as a discharge current i through the discharge resistor 4, and a voltage $V_c$ at both ends of the capacitor 1 drops. During this period, the voltage $V_a$ at the voltage division point A between the first resistor 6 and the second resistor 7 of the resistor voltage dividing circuit 8, which is connected in parallel to the capacitor 1, is measured and inputted to the control device 9. At time $t_n$ after elapse of a predetermined conduction time (discharge time T), the discharge switch 3 is opened according to a command from the control device 9, the discharge current i stops, and charging of the capacitor 1 is restarted by the charging circuit 2.

FIG. 4 shows a relationship between On-time of the discharge switch 3 of the discharge circuit 5, time of a charging stop command to the charging circuit 2, and a capacitor voltage to be measured. The discharge time T is set to a very short time that does not interfere with operation of a power apparatus using the energy of the capacitor 1 and that is less than 1 s (second), for example, to about 200 ms. The time that does not interfere with operation of the power apparatus is a time within which the power apparatus can be operated even with a decreased capacitor voltage and which is taken until the capacitor voltage reaches a predetermined voltage (threshold) which is set such that the power apparatus cannot be operated when the capacitor voltage further decreases therefrom.

The time during the charging stop command, that is, the time during which charging of the capacitor 1 is stopped, is equal to the time during which the discharge switch 3 of the discharge circuit 5 is turned on. While the switch 3 of the discharge circuit is turned on, a change in the voltage $V_a$ at the voltage division point A between the first resistor 6 and the second resistor 7 (voltage drop) is inputted as measurement data to the control device 9.

Next, a method for calculating a capacitor capacitance C from the voltage $V_a$ at the voltage division point A that is inputted to the control device 9 will be described with reference to FIG. 5.

FIG. 5 shows a state where a capacitor voltage $V_c$ drops during a charging stop period T for the capacitor 1. Capacitor voltages $V_0$ and $V_n$ are voltages at times $t_0$ and $t_n$, respectively, and are voltages before and after discharge. Capacitor voltages $V_1$ and $V_{n-1}$ are voltages at times $t_1$ and $t_{n-1}$, respectively.

When the resistance values of the first resistor 6 and the second resistor 7 are denoted by $R_1$ and $R_2$, respectively, the voltage $V_c$ of the capacitor 1 during the period T is represented by $$V_c = (R_1 + R_2) \times V_a / R_1 \qquad \text{Expression (1)}.$$

Thus, the capacitor voltage $V_c$ can be calculated by using the measurement data $V_a$ inputted to the control device 9. A gradient $\Delta V_c$ of the voltage drop during this period is represented by $$\Delta V_c = (V_0 - V_n)/T \qquad \text{Expression (2)}.$$

Since the discharge switch 3 of the discharge circuit 5 is conducted for a very short time, discharge can be considered to be performed at a substantially constant current from the capacitor 1 to be measured to the discharge resistor 4. Thus, the gradient $\Delta V_c$ can be approximated to a straight line as shown in FIG. 5.

From a relational expression represented by Expression (3) of the capacitor capacitance C, the capacitor voltage $V_c$, and electric charge Q stored in the capacitor 1, a relational expression represented by Expression (4) of the capacitor voltage $V_0$ before discharge, the capacitor voltage $V_n$ after discharge, the current i during discharge, and the time T for discharge can be obtained.

Expression (5) is an expression obtained by solving Expression (4) for the capacitor capacitance C. In Expression (5), the discharge current i is represented as $i=V_c^*/R_d$ on the basis of an average capacitor voltage $V_c^*$ during discharge and the resistance value $R_d$ of the discharge resistor 4. When represented using this relational expression and Expression (2), Expression (6) is obtained. That is, by using Expression (6), the capacitor capacitance C can be calculated from the capacitor voltage $V_c$ (average capacitor voltage $V_c^*$) during the period when the discharge switch 3 of the discharge circuit 5 is turned on.

$$C \times V_c = Q \qquad \text{Expression (3)}$$

$$C \times (V_0 - V_n) = \int i \, dt = i \times T \qquad \text{Expression (4)}$$

$$C = i \times T \div (V_0 - V_n) \qquad \text{Expression (5)}$$

$$C = V_c^* / (R_d \cdot \Delta V_c) \qquad \text{Expression (6)}$$

The average capacitor voltage $V_c^*$ can be calculated by dividing the sum of $V_c$ calculated by Expression (1) from $V_a$ measured within the time T, by the number of measurement points. Moreover, the gradient $\Delta V_c$ of the capacitor voltage drop can be calculated by using data of the measurement capacitor voltage $V_c$ calculated from the measured $V_a$. Since the gradient $\Delta V_c$ of the capacitor voltage drop can be approximated to a straight line as described above, the data of the measurement capacitor voltage $V_c$ may be approximated to a straight line by the least-squares method. Alternatively, for example, the measurement points for the data of the measured capacitor voltage $V_c$ within the time T are equally divided into two groups, and the gradient $\Delta V_c$ of the capacitor voltage drop can be calculated by moving average in which the difference between the average of the measurement capacitor voltages $V_c$ of the first half group and the average of the measurement capacitor voltages $V_c$ of the second half group is divided by T/2.

[Capacitor Voltage Fluctuation: When Abnormality Occurs]

Next, the case where the capacitor voltage or the voltage in a capacitor voltage measuring circuit temporarily fluctuates due to poor contact in wiring connection, surge, or the like (hereinafter, referred to as abnormality occurrence) when the discharge switch 3 of the discharge circuit 5 is conducted and the capacitor capacitance is calculated, will be described.

Similar to FIG. 5, FIGS. 6A to 6C each show a state where the capacitor voltage $V_c$ drops during the charging stop period T for the capacitor 1. FIG. 6A shows the case where an abnormality such as poor contact in wiring connection or surge does not occur during capacitor capacitance measurement. FIGS. 6B and 6C each show the case where an abnormality occurs. In the graphs in FIGS. 6B and 6C, a dotted line denotes the capacitor voltage $V_c$ calculated at each time from the measured Va (indicated by a measured value in each drawing), and a solid line (indicated by a calculated value in each drawing) denotes $\Delta V_c$ within the period T and is obtained, for example, through linear approximation by the least-squares method, using the data of the measurement capacitor voltage $V_c$ within the period T.

In FIG. 6A in which an abnormality does not occur, a gradient that is a voltage drop read from the measurement capacitor voltage $V_c$ (measured value) calculated at each measurement time within the period T is equal to a calculated gradient $\Delta V_{ca}$.

In FIG. 6B in which an abnormality occurs, occurrence of noise is recognized at time $t_x$ for the measurement capacitor voltage $V_c$ (measured value) calculated at each measurement time within the period T, and $V_c$ exhibits behavior indicated by X in the drawing. Thus, $\Delta V_{cb}=(V_0-V_{n1})/T$ obtained in consideration of the noise occurrence portion is larger than $\Delta V_x=(V_0-V_{nx})/T$ calculated by excluding the noise portion X of $V_c$ which is measurement data. Therefore, a capacitor capacitance smaller than the original capacitor capacitance is calculated.

In the case of noise occurrence as described above, it is determined that the capacitor capacitance drops from a predetermined value, so that it is falsely determined that the capacitor is defective or it is capacitor replacement time.

In FIG. 6C in which an abnormality occurs, for the measurement capacitor voltage $V_c$ (measured value) calculated at each measurement time within the period T, for example, poor contact in wiring connection occurs at time $t_y$, and, thereafter, $V_c$ exhibits behavior indicated by Y in the drawing. Thus, $\Delta V_{cc}=(V_0-V_{n2})/T$ obtained in consideration of the abnormality occurrence is larger than $\Delta V_y=(V_0-V_{ny})/T$ calculated by ignoring a portion after time $t_y$ on the assumption that no abnormality occurs in $V_c$ which is measurement data. Therefore, a capacitor capacitance smaller than the original capacitor capacitance is calculated.

In this case as well, it is determined that the capacitor capacitance drops from a predetermined value, so that it is falsely determined that the capacitor is defective or it is capacitor replacement time.

[Correct/False Determination for Capacitor Capacitance Measurement]

Next, a method for determining whether the calculated capacitor capacitance is correct will be described with reference to the drawings. In the charging stop period T for the capacitor 1 in which the discharge switch 3 is conducted, the voltage of the capacitor linearly drops as described with reference to FIG. 5. By using this fact, time difference of the data of the measurement capacitor voltage is checked, whereby a phenomenon of deviation from a straight line such as noise occurrence can be confirmed.

Figure 7A:
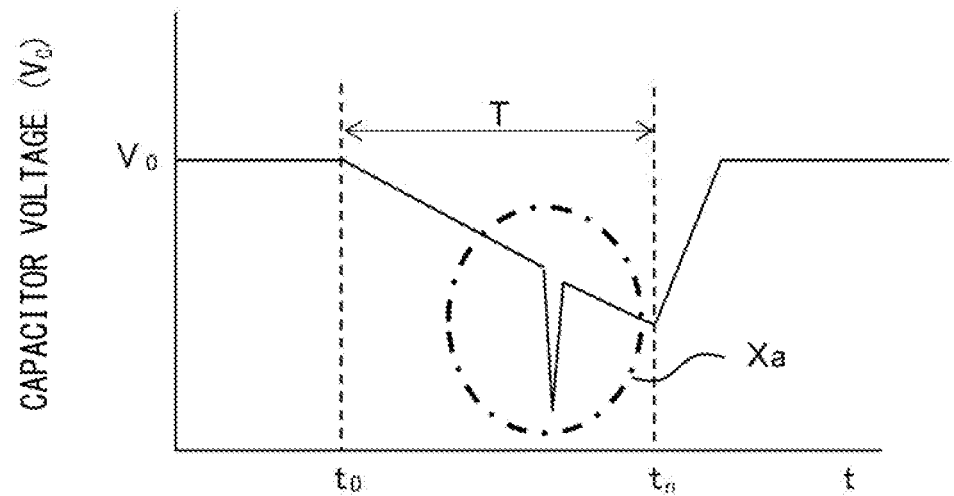
FIGS. 7A and 7B illustrate a method for performing correct/false determination for capacitor capacitance measurement according to Embodiment 1 of the present invention.
Figure 7B:
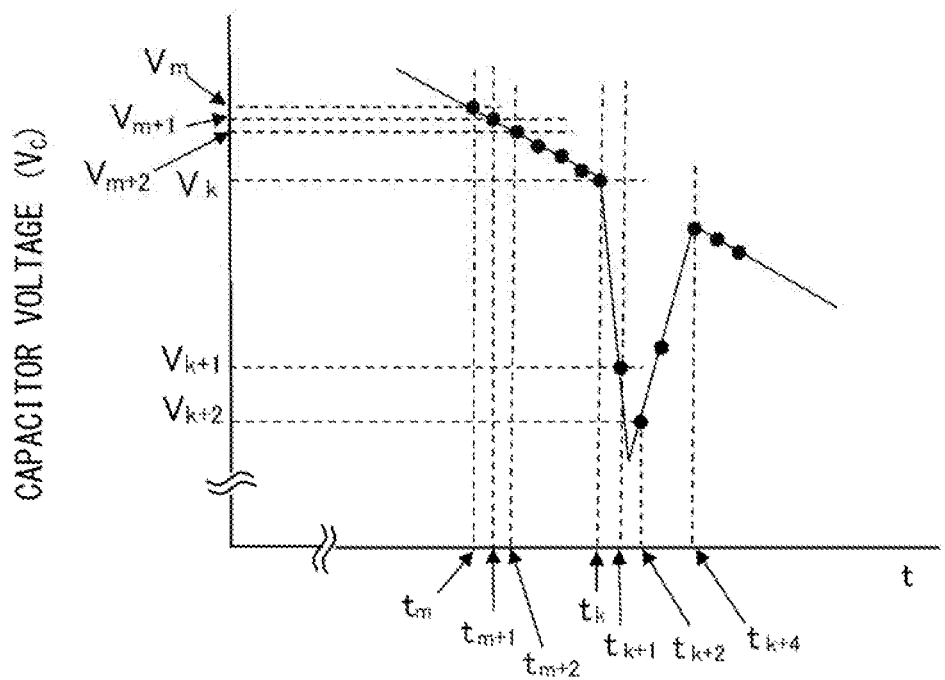

FIGS. 7A and 7B illustrate a method for determining whether a capacitor capacitance calculated by using the example in FIG. 6B is correct. FIG. 7A shows a state where the capacitor voltage $V_c$ drops in the charging stop period T for the capacitor 1 in FIG. 6B, and FIG. 7B shows the interior of a region Xa in an enlarged manner.

In FIG. 7B, for simplicity, a time interval $\Delta t$ is set as follows.

$$\Delta t = t_{m+1}-t_m = t_{m+2}-t_{m+1} = t_{k+1}-t_k = t_{k+2}-t_{k+1}$$

The capacitor voltage difference between times $t_m$ and $t_{m+1}$ is $V_m-V_{m+1}$, and the gradient thereof is $$\Delta V_x = (V_m-V_{m+1})/\Delta t.$$

At time $t_{m+2}$ which is the next time step, the capacitor voltage difference between times $t_{m+1}$ and $t_{m+2}$ is $V_{m+1}-V_{m+2}$, and the gradient thereof is substantially equal to $\Delta V_x$.

In a time period in which noise occurs, the capacitor voltage difference between times $t_k$ and $t_{k+1}$ is $V_k-V_{k+1}$, and the gradient thereof is $$\Delta V_x < (V_k-V_{k+1})/\Delta t,$$

and is larger than $\Delta V_x$. In addition, similarly, at time $t_{k+2}$ which is the next time step, the capacitor voltage difference between times $t_{k+1}$ and $t_{k+2}$ is $V_{k+1}-V_{k+2}$, and the absolute value of the gradient thereof is $$\Delta V_x < |V_{k+1}-V_{k+2}|/\Delta t$$

and is larger than $\Delta V_x$. The fact that the gradient of a drop of capacitor voltages measured between certain times is larger than $\Delta V_x$ means that the gradient deviates from a straight line of a voltage drop.

Although the constant time interval $\Delta t$ is used here for simplicity, a time difference in the voltage may be obtained by using an optional time interval.

Moreover, the description has been given focusing on the interior of the region Xa shown in FIG. 7A in which the time change in capacitor voltage is large due to noise occurrence, but the discharge switch 3 is conducted, and a difference in the capacitor voltage between measurement times is sequentially confirmed over the charging stop period T for the capacitor 1.

As described above, the voltage drop of the capacitor voltage during the capacitor charging stop period can be approximated to a straight line, the gradient thereof is $\Delta V_x$, and the voltage difference at $\Delta t$ is $V_m-V_{m+1}$. Thus, a difference in the capacitor voltage between measurement times is sequentially confirmed. If a difference from $V_m-V_{m+1}$ is caused, that is, if behavior deviating from a straight line is exhibited, it can be determined that some abnormality occurs during the period T and the capacitor capacitance calculated by using the average capacitor voltage in this period is not correct.

For a difference from $V_m-V_{m+1}$, a threshold may be determined in advance. For example, when a threshold is set such that up to five times $V_m-V_{m+1}$ is acceptable, if a voltage difference is calculated during the period T and compared with the threshold and the maximum value thereof becomes equal to or larger than five times $V_m-V_{m+1}$, it can be determined that the calculated capacitor capacitance is not correct.

Therefore, correct/false determination for the value of the measured capacitor capacitance is enabled.

As the threshold, the threshold that is five times $V_m-V_{m+1}$ is exemplified. If the threshold is decreased, occurrence of small noise having almost no effect on capacitor capacitance measurement is detected. As a result of repeated measurements, the threshold that is five times $V_m-V_{m+1}$ is found to be effective as a value with which occurrence of noise having an effect on capacitor capacitance measurement, as shown in FIGS. 7A and 7B, can be clearly determined.

In Embodiment 1, by using the fact that the capacitor voltage linearly drops in the charging stop period T for the capacitor 1 in which the discharge switch 3 is conducted, a difference in the capacitor voltage between measurement times during this period is checked, and presence/absence of abnormality occurrence can be determined on the basis of whether the difference is equal to or larger than the threshold, so that it can be determined whether the capacitor capacitance calculated in this period is correct. Accordingly, the accuracy of calculation of the capacitor capacitance improves, and it is not falsely determined that the capacitor capacitance is insufficient, so that there is an effect of eliminating unnecessary replacement of the capacitor.

Embodiment 2

In Embodiment 1, the method, in which a difference in the capacitor voltage between measurement times during the charging stop period T for the capacitor 1 in which the discharge switch 3 is conducted is checked, and presence/absence of abnormality occurrence and whether the capacitor capacitance calculated in this period is correct are determined on the basis of whether the difference is equal to or larger than the threshold, has been described. In Embodiment 2, a method, in which a difference in the capacitor voltage between measurement times during the charging stop period T for the capacitor 1 in which the discharge switch 3 is conducted is accumulated, and presence/absence of abnormality occurrence and whether the capacitor capacitance calculated in this period is correct are determined on the basis of whether the sum (accumulated value) of such differences is equal to or larger than a threshold, will be described with reference to FIGS. 6A to 7B.

In the case of FIG. 6A in which there is no abnormality, when the stop period is set to the period from $t_0$ to $t_n$, an accumulated value σa of the absolute values of the time differences of the capacitor voltages at the respective measurement times in this period is as follows.

$$\sigma a = \sum_{m=0}^{n-1} \frac{|Vm - Vm+1|}{tm+1 - tm} = n \cdot \Delta V_{ca} \quad \text{[Math. 1]}$$

Meanwhile, in the case of FIG. 6B in which an abnormality occurs, an accumulated value σb of the absolute values of the time differences of the capacitor voltages at the respective measurement times is as follows.

$$\sigma b = \sum_{m=0}^{n-1} \frac{|Vm - Vm+1|}{tm+1 - tm} > n \cdot \Delta V_x \quad \text{[Math. 2]}$$

As shown in FIG. 7B, a time change in capacitor voltage is large between times $t_k$ and $t_{k+4}$. Thus, the accumulated value σb is larger than $n \cdot \Delta V_x$ which is the sum of the time differences of the original capacitor voltages excluding the capacitor voltages in the time period in which the noise occurs. The fact that the sum of the absolute values of the gradients of drops of the capacitor voltages measured between certain times is larger than $n \cdot \Delta V_x$ means that a site where the gradient deviates from a straight line of a voltage drop is present in the measurement time period.

Here, for example, a threshold may be set in advance such that up to three times is acceptable. The sum of voltage differences is calculated during the period T, and, if the value of the sum is equal to or larger than three times the sum ($n \cdot \Delta V_x$) of originally caused differences, it can be determined that the calculated capacitor capacitance is not correct.

In the method of Embodiment 2, for abnormality occurrence that causes a gentle change as shown in FIG. 6C unlike noise, it is possible to determine presence/absence of abnormality occurrence and whether the capacitor capacitance calculated in the period is correct. In the case of FIG. 6C, a sum σc of the absolute values of the differences in the capacitor voltage between measurement times is represented as follows.

$$\sigma c = \sum_{m=0}^{n-1} \frac{|Vm - Vm+1|}{tm+1 - tm} > n \cdot \Delta V_y \quad \text{[Math. 3]}$$

As seen from FIG. 6C, a potential difference at each time until time $t_y$ is not greatly different from $\Delta V_y$, but the gradient increases after $t_y$, and, as a result, the sum σc becomes larger than the sum ($n \cdot \Delta V_y$) of the absolute values of the time differences of the original capacitor voltages.

Thus, similar to FIG. 6B, for example, a threshold is set in advance such that up to three times the sum ($n \cdot \Delta V_y$) of the absolute values of the time differences of the original capacitor voltages is acceptable, the sum of the time differences of the measurement capacitor voltages at the respective measurement times is calculated during the period T, the accumulated value is compared with the threshold, and, if the accumulated value exceeds the threshold, it can be determined that the calculated capacitor capacitance is not correct.

As the threshold, the threshold that is three times $n \cdot \Delta V_y$ is exemplified. If the threshold is decreased, matter having almost no effect on capacitor capacitance measurement is also detected as an abnormality. As a result of repeated measurements, the threshold that is three times $n \cdot \Delta V_y$ is found to be effective as a value with which 90% of poor contact, shown in FIG. 6C, having an effect on capacitor capacitance measurement can be eliminated.

In the above description, the sum of the absolute values of the differences in the measurement capacitor voltage between measurement times is simply calculated as a total sum, but, when a sum of squares is calculated, the time difference in the measurement capacitor voltages between measurement times is emphasized, so that the determination can be more clearly performed.

As described above, in Embodiment 2, by using the fact that the capacitor voltage linearly drops in the charging stop period T for the capacitor 1 in which the discharge switch 3 is conducted, the absolute value of the difference in the measured capacitor voltage between measurement times in this period is accumulated, and presence/absence of abnormality occurrence can be determined on the basis of whether the sum is equal to or larger than the threshold, so that it can be determined whether the capacitor capacitance calculated in this period is correct. Accordingly, the accuracy of calculation of the capacitor capacitance improves, so that there is an effect of eliminating replacement of the capacitor that occurs since it is falsely determined that the capacitor capacitance is insufficient although replacement of the capacitor is actually unnecessary.

Embodiment 3

In Embodiments 1 and 2, by using the data itself of the measurement capacitor voltage at each measurement time during the charging stop period T for the capacitor 1 in which the discharge switch 3 is conducted, the difference in the measured capacitor voltage between the measurement times is confirmed or the sum of the absolute values of such differences is obtained, and presence/absence of abnormality occurrence is determined on the basis of whether the difference or the sum is within the predetermined threshold, so that it is determined whether the capacitor capacitance calculated in this period is correct. In Embodiment 3, a method for determining presence/absence of abnormality occurrence and whether the capacitor capacitance calculated in the period, by using data of a measurement capacitor voltage at each measurement time and a gradient (straight line) of the capacitor voltage calculated using the data, will be described.

Figure 8:
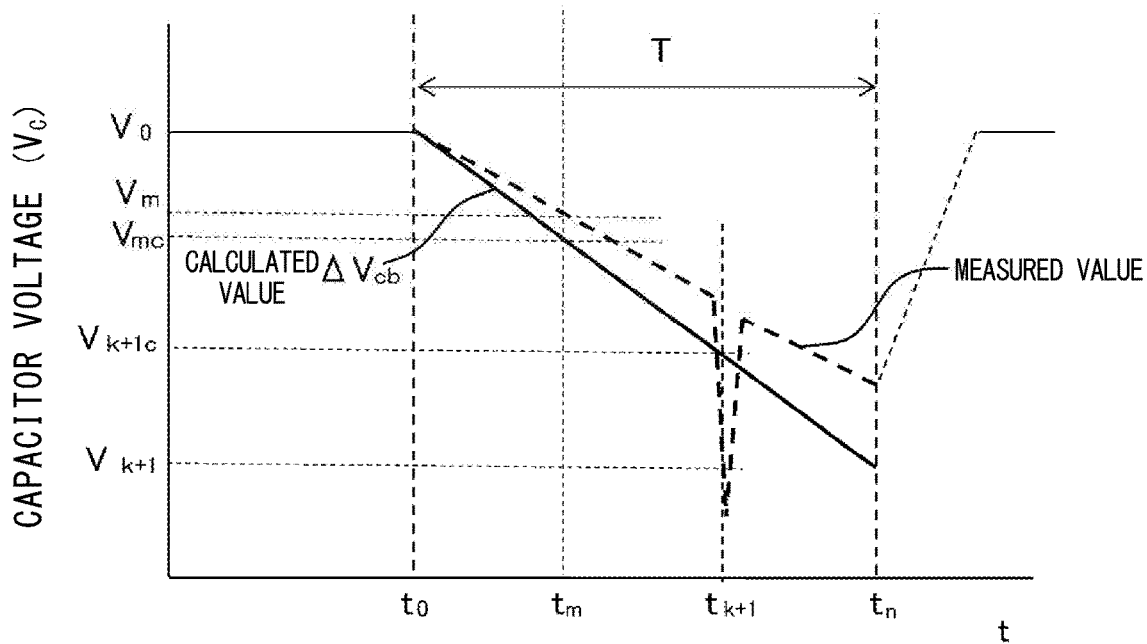
FIG. 8 illustrates a method for performing correct/false determination for capacitor capacitance measurement according to Embodiment 3 of the present invention.

FIG. 8 illustrates a method for performing correct/false determination for a measured capacitor capacitance according to Embodiment 3. FIG. 8 shows transition (dotted line) of data of a measurement capacitor voltage at each measurement time during the charging stop period T for the capacitor 1 in which the discharge switch 3 is conducted, and a gradient $\Delta V_{cb}$ (solid line) of a capacitor voltage drop calculated using the data. FIG. 8 shows an example in the case where an abnormality occurs (noise occurs) during the charging stop period T for the capacitor 1, similar to FIG. 6B.

Since the voltage of the capacitor linearly drops in the period in which the discharge switch 3 is turned on, $\Delta V_{cb}$ is approximated to a straight line by the least-squares method or moving average, using the measurement capacitor voltage, as described in Embodiment 1.

In FIG. 8, the difference between a measurement capacitor voltage $V_m$ and a capacitor voltage $V_{mc}$ on the $\Delta V_{cb}$ straight line at time $t_m$ is obtained. Such a difference is obtained at each measurement time. The difference at time $t_{k+1}$ is larger than that at time $t_m$.

In the case where there is no abnormality as in FIG. 6A, such a difference is very small and is comparable to a measurement error. Therefore, the difference between the measurement capacitor voltage and the capacitor voltage on the $\Delta V_{cb}$ straight line at each measurement time during the charging stop period T for the capacitor 1 is compared with a predetermined threshold. If the maximum value of the difference is equal to or larger than the predetermined threshold, it is determined that an abnormality occurs during the period T. The threshold for determining that an abnormality occurs may be determined in advance. For example, when a threshold is set such that up to five times the measurement error is acceptable, if the maximum value of the difference between the measurement capacitor voltage and the capacitor voltage on the $\Delta V_{cb}$ straight line during the period T becomes equal to or larger than five times the measurement error, it can be determined that the calculated capacitor capacitance is not correct.

Therefore, it can be determined whether the calculated capacitor capacitance is correct.

Similar to Embodiment 1, as the threshold, the threshold that is five times the measurement error is exemplified. If the threshold is decreased, occurrence of small noise having almost no effect on capacitor capacitance measurement is detected. As a result of repeated measurements, the threshold that is five times the measurement error is found to be effective as a value with which occurrence of noise having an effect on capacitor capacitance measurement, as shown in FIGS. 7A to 8, can be clearly determined.

As described above, in Embodiment 3, by using the fact that the capacitor voltage linearly drops in the charging stop period T for the capacitor 1 in which the discharge switch 3 is conducted, presence/absence of abnormality occurrence can be determined on the basis of whether the maximum value of the difference between the data of the measurement capacitor voltage at each measurement time during this period and the voltage on the gradient straight line of the capacitor voltage calculated using the data is equal to or larger than the threshold, so that it can also be determined whether the capacitor capacitance calculated in this period is correct. Accordingly, the accuracy of calculation of the capacitor capacitance improves, so that there is an effect of eliminating replacement of the capacitor that occurs since it is falsely determined that the capacitor capacitance is insufficient although replacement of the capacitor is actually unnecessary.

Embodiment 4

In Embodiment 3, on the basis of whether the maximum value of the difference between the measurement capacitor voltage obtained by measurement and the capacitor voltage on the gradient $\Delta V_{cb}$ straight line of the capacitor voltage calculated during the charging stop period T for the capacitor 1 in which the discharge switch 3 is conducted is equal to or larger than the predetermined threshold, presence/absence of abnormality occurrence and whether the capacitor capacitance calculated in this period is correct are determined. In Embodiment 4, a method, in which the absolute value of the difference between the capacitor voltage obtained by measurement and the capacitor voltage on the gradient $\Delta V_{cb}$ straight line of the capacitor voltage calculated using this capacitor voltage during the charging stop period T for the capacitor 1 in which the discharge switch 3 is conducted is accumulated, and presence/absence of abnormality occurrence and whether the capacitor capacitance calculated in this period is correct are determined on the basis of whether the sum of such absolute values is equal to or larger than a threshold, will be described with reference to FIGS. 8 to 9.

As described in Embodiment 3, in the case where there is no abnormality as in FIG. 6A, the difference between a capacitor voltage obtained by sampling and a capacitor voltage on a gradient $\Delta V$ straight line of a capacitor voltage calculated is comparable to a measurement error. When the sum of such differences from time $t_0$ to time $t_n$ during the period T is obtained, the sum is a sufficiently small value. The accumulated value of such measurement errors is set as a reference value, and the sum of the absolute values of the differences between measurement capacitor voltages obtained by measurement from time $t_0$ to time $t_n$ during the period T in FIG. 8 and the capacitor voltages on the gradient $\Delta V_{cb}$ straight line of capacitor voltages calculated using the measurement capacitor voltages is obtained. For example, when a threshold is set in advance such that up to three times the reference value is acceptable, if the accumulated value of the absolute values of the differences between the measurement capacitor voltages obtained by measurement during the period T and the capacitor voltages on the gradient $\Delta V_{cb}$ straight line of the capacitor voltages calculated is compared with the threshold and exceeds the threshold, it can be determined that the calculated capacitor capacitance is not correct.

In the method of Embodiment 4, for abnormality occurrence that causes a gentle change as shown in FIG. 6C unlike noise, it is possible to determine presence/absence of abnormality occurrence and whether the capacitor capacitance calculated in the period is correct.

Figure 9:
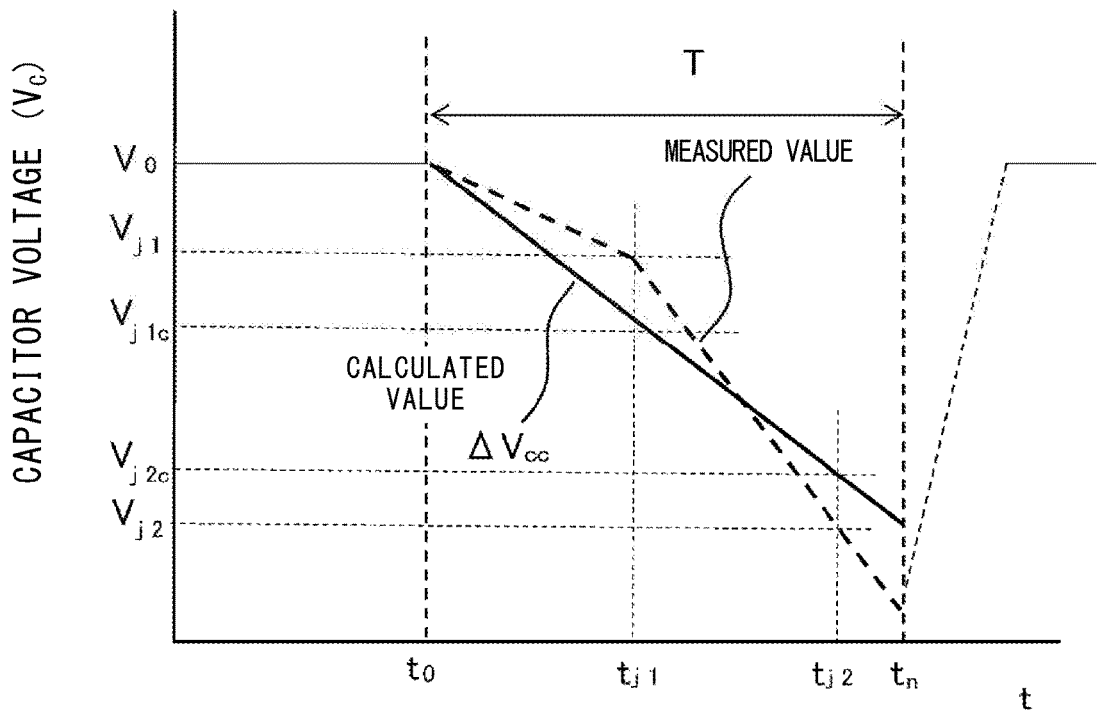
FIG. 9 illustrates a method for performing correct/false determination for capacitor capacitance measurement according to Embodiment 4 of the present invention.

FIG. 9 illustrates Embodiment 4 using FIG. 6C. FIG. 9 shows transition (dotted line) of data of a measurement capacitor voltage at each measurement time, and a gradient $\Delta V_{cc}$ (solid line) of a capacitor voltage drop calculated using the data. For example, the difference between a measurement capacitor voltage $V_{j1}$ obtained by measurement and a capacitor voltage $V_{j1c}$ on the $\Delta V_{cc}$ straight line at time $t_{j1}$ is obtained. Similarly, the difference between a measurement capacitor voltage $V_{j2}$ obtained by measurement and a capacitor voltage $V_{j2c}$ on the $\Delta V_{cc}$ straight line at time $t_{j2}$ is obtained. In the case of an abnormality that causes a gentle change in voltage, in Embodiment 3, it is not determined that there is an abnormality, on the basis of a simple difference such as $V_{j1}-V_{j1c}$ or $|V_{j2}-V_{j2c}|$ in some cases. However, in the present embodiment, since (the absolute value of) the difference at each time is accumulated, such determination is enabled. That is, similar to FIG. 8, for example, a threshold is set in advance such that up to three times the reference value is acceptable, the accumulated value of the absolute values of the differences between the measurement capacitor voltages obtained by measurement during the period T and the capacitor voltages on the $\Delta V_{cc}$ straight line which is the gradient of the capacitor voltages calculated is compared with the threshold, and, if the accumulated value exceeds the threshold, it can be determined that the calculated capacitor capacitance is not correct.

Similar to Embodiment 2, as the threshold, the threshold that is three times the reference value is exemplified. If the threshold is decreased, matter having almost no effect on capacitor capacitance measurement is also detected as an abnormality. As a result of repeated measurements, the threshold that is three times the reference value is found to be effective as a value with which 90% of poor contact, shown in FIG. 6C, having an effect on capacitor capacitance measurement can be eliminated.

In the above description, the accumulated value of the absolute values of the differences between the measurement capacitor voltages obtained by measurement and the capacitor voltages on the gradient $\Delta V_{cc}$ straight line of the capacitor voltages calculated is calculated simply as a total sum, but, when a sum of squares is calculated, the differences between the measurement capacitor voltages and the capacitor voltages on the $\Delta V_{cc}$ straight line become more considerable, so that the determination can be clearly performed.

As described above, in Embodiment 4, by using the fact that the capacitor voltage linearly drops in the charging stop period T for the capacitor 1 in which the discharge switch 3 is conducted, the absolute value of the difference between the data of the measurement capacitor voltage at each measurement time during this period and the voltage on the gradient of the capacitor voltage calculated using the data is accumulated, and presence/absence of abnormality occurrence can be determined on the basis of whether the accumulated value of such absolute values is equal to or larger than the threshold. Furthermore, it can be determined whether the capacitor capacitance calculated in this period is correct. Accordingly, the accuracy of calculation of the capacitor capacitance improves, so that there is an effect of eliminating replacement of the capacitor that occurs since it is falsely determined that the capacitor capacitance is insufficient although replacement of the capacitor is actually unnecessary.

In Embodiments 3 and 4 described above, as the gradient $\Delta V$ of the capacitor voltage calculated in the period T (the solid lines in FIGS. 6A to 6C, FIGS. 7A and 7B, and FIG. 8), a gradient that is approximated to a straight line by the least-squares method using the data of the measurement capacitor voltage $V_c$ within the period T, is used, but the gradient $\Delta V$ may be calculated by another method. For example, moving average may be used. An average capacitor voltage $V_c^*$ calculated by dividing the sum of $V_c$ calculated from $V_a$ measured within the time T by the number of measurement points may be used, the time T may be equally divided, and a value (moving average) obtained by dividing the difference of the average of voltages of the capacitor in the first half period and the average of voltages of the capacitor in the second half period by ½ of the time T may be used as the time change value $\Delta V$ of the voltage of the capacitor.

Each $\Delta V$ is approximated to a straight line by data including a measurement capacitor voltage generated due to noise or the like. Thus, when a measurement capacitor voltage and a difference are calculated at each measurement time, the difference becomes large when an abnormality occurs, and thus the difference can be used for correct/false determination for a capacitor capacitance.

Moreover, in Embodiments 3 and 4 described above, the measurement error is used as a reference value for determining a threshold for determining whether the calculated capacitor capacitance is correct, but the threshold is not limited thereto. The threshold may be determined from past data, or may be determined from the fluctuation average or progress of the capacitor voltage every period T.

Embodiment 5

In Embodiments 1 to 4, in the control device 9, a capacitor capacitance is calculated, and determination as to whether the calculated capacitor capacitance is correct, that is, correct/false determination for capacitor capacitance measurement, is performed. In Embodiment 5, a further correct capacitor capacitance is calculated on the basis of the correct/false determination, and it is determined whether the capacitor capacitance is insufficient. This method will be described with reference to FIGS. 10 and 11.

Figure 10:
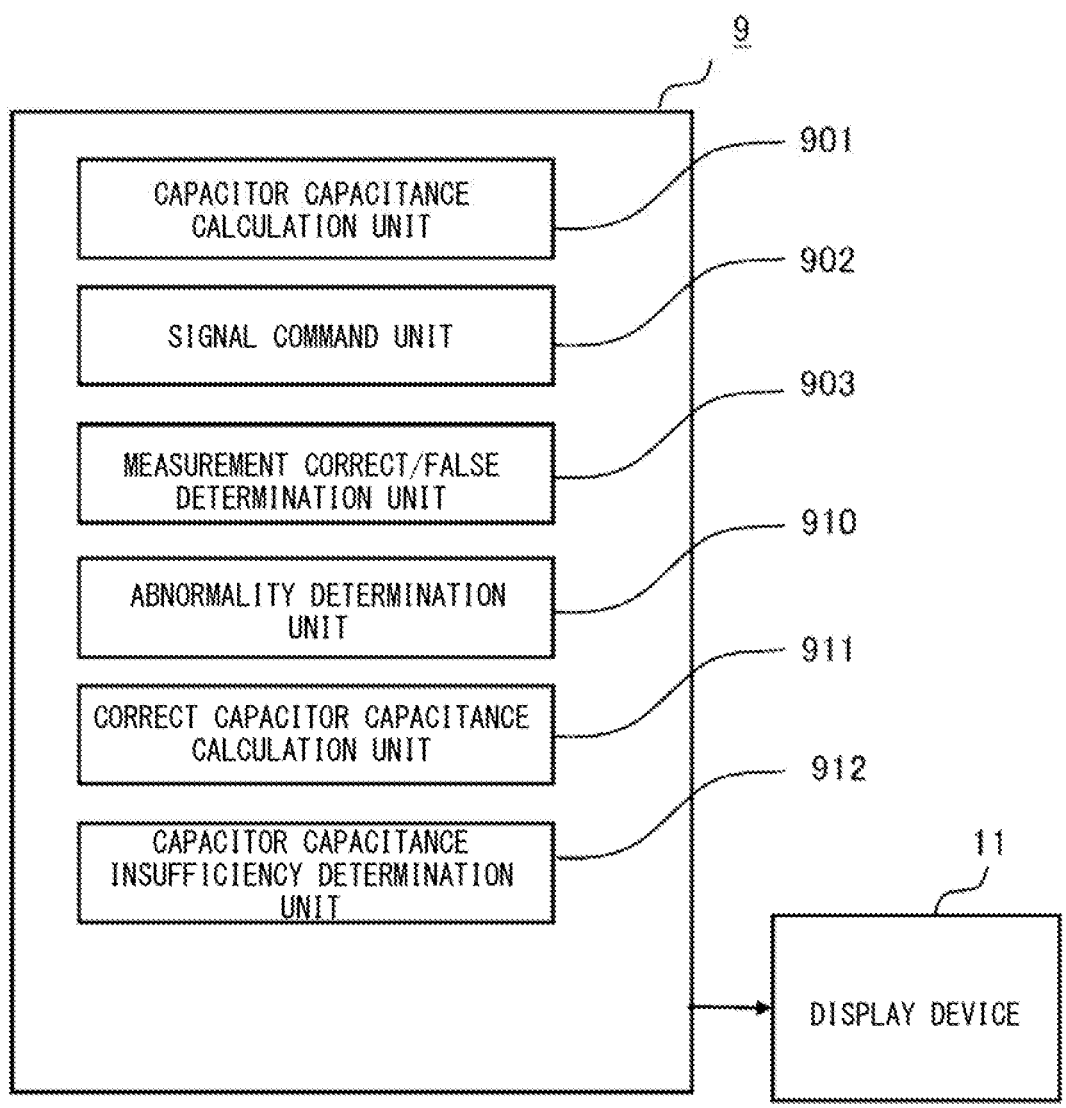
FIG. 10 is a block diagram illustrating the function of a control device in a capacitor capacitance measurement device according to Embodiment 5 of the present invention.

FIG. 10 is a block diagram illustrating the function of a control device of a capacitor capacitance measurement device according to Embodiment 5 of the present invention. In FIG. 10, in addition to the functions shown in FIG. 2, the control device 9 includes an abnormality determination unit 910 which determines whether an abnormality has occurred, if it is determined to be false by the measurement correct/false determination unit 903, a correct capacitor capacitance calculation unit 911 which calculates a further correct capacitor capacitance if it is determined to be correct by the measurement correct/false determination unit 903, and a capacitor capacitance insufficiency determination unit 912 which determines whether the capacitor capacitance is insufficient, on the basis of the capacitor capacitance calculated by the correct capacitor capacitance calculation unit 911. If it is determined that a warning about capacitance insufficiency is needed due to a drop in the capacitor capacitance, the warning is displayed on a display device 11 of the capacitor capacitance measurement device 10 for notification. What is displayed on the display device 11 is not limited to capacitor capacitance insufficiency.

Figure 11:
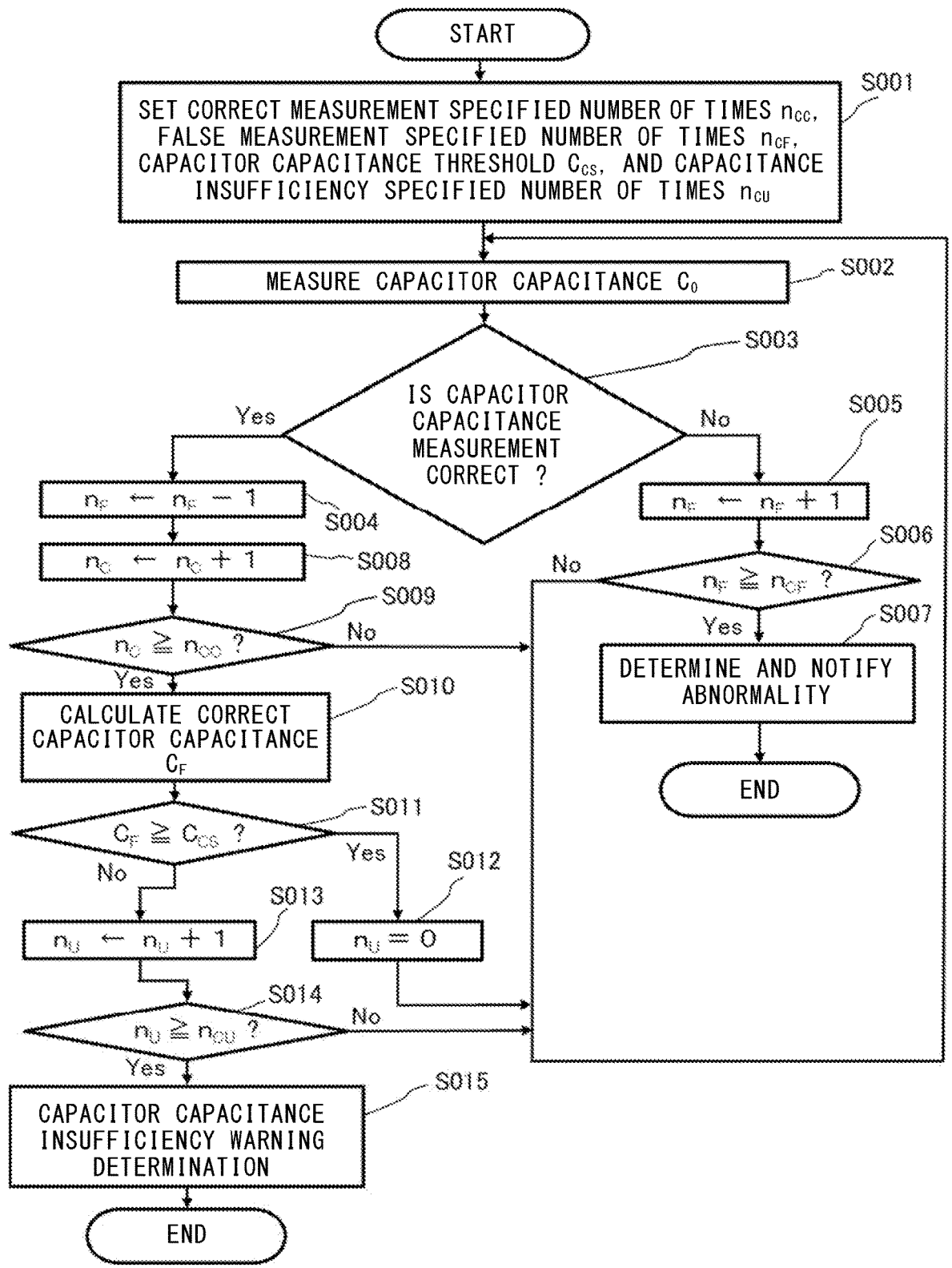
FIG. 11 is a flowchart showing an operation process of the capacitor capacitance measurement device according to Embodiment 5 of the present invention.

FIG. 11 is a flowchart showing operation in Embodiment 5 of the present invention.

In FIG. 11, in the control device 9 of the capacitor capacitance measurement device, the capacitor capacitance calculation unit 901 performs processes in steps S001 and S002, the measurement correct/false determination unit 903 performs a process in step S003, the abnormality determination unit 910 performs processes in steps S004 to S007, the correct capacitor capacitance calculation unit 911 performs processes in steps S008 to S010, and the capacitor capacitance insufficiency determination unit 912 performs processes in steps S011 to S015.

In the processing processes, first, in step S001, a correct measurement specified number of times $n_{CC}$, a false measurement specified number of times $n_{CF}$, a capacitor capacitance threshold $C_{CS}$, and a capacitance insufficiency specified number of times $n_{CU}$ are set.

The correct measurement specified number of times $n_{CC}$ is the number of measurements for calculating the median or average of capacitor capacitance. As for the capacitor capacitance, even when measurement is correct, there is a possibility that the capacitor capacitance is an abnormal value. Thus, the capacitor capacitance is measured $n_{CC}$ times such that the influence of such abnormal values is reduced. Here, the correct measurement specified number of times $n_{CC}$ is set to 16 times.

The false measurement specified number of times $n_{CF}$ is the number of times it is determined that, when capacitor capacitance measurement is not correct, the cause therefor is not poor contact in wiring connection or surge.

When capacitor capacitance measurement is carried out once an hour, if the cause for the capacitor capacitance being not correct is poor contact in wiring connection or surge, it is determined that the cause can be eliminated within 10 days, and thus the false measurement specified number of times $n_{CF}$ is set to 240 times.

The capacitor capacitance threshold $C_{CS}$ is a value at which capacitor capacitance insufficiency should be warned.

The value is set by the minimum capacitance that should be ensured by the capacitor in a circuit.

The capacitance insufficiency specified number of times $n_{CU}$ is the number of times that is the number of consecutive times the capacitor capacitance is less than the capacitor capacitance threshold $C_{CS}$ and that is for determining that a warning about capacitance insufficiency is needed.

The capacitor capacitance gradually drops with fluctuations. In order to assuredly warn about capacitance insufficiency, the capacitance insufficiency specified number of times $n_{CU}$ is set to three times.

In step S002, by any of the methods of Embodiments 1 to 4, a capacitor capacitance $C_0$ is measured, and it is determined whether the measurement is correct.

In step S003, as a result of step S002, if the capacitor capacitance measurement is correct, the processing proceeds to step S004, and, if the capacitor capacitance measurement is not correct, the processing proceeds to step S005.

In step S004, 1 is subtracted from a false measurement number of times $n_F$ which is the cumulative number of false measurements, and the processing proceeds to step S008. If the result of the subtraction of 1 from the false measurement number of times $n_F$ is a negative value, the false measurement number of times $n_F$ is set to 0, and the processing proceeds to step S008.

In step S005, 1 is added to the false measurement number of times $n_F$, and the processing proceeds to step S006.

In step S006, it is determined whether the false measurement number of times $n_F$ has reached the false measurement specified number of times $n_{CF}$. If the false measurement number of times $n_F$ has not reached the false measurement specified number of times $n_{CF}$, the capacitor capacitance measurement is continued (returns to step S002). If the false measurement number of times $n_F$ has reached the false measurement specified number of times $n_{CF}$, it is determined that an abnormality has occurred, and the processing proceeds to step S007.

As for calculation of the above false measurement number of times $n_F$, the example in which 1 (here, the description is given with a set value as 1) is added if the measurement is false, and 1 is subtracted if the measurement is correct, has been described. However, 1 may be added only if the measurement is false, or the false measurement number of times $n_F$ may be the cumulative number of consecutive false measurements.

In step S007, to notify the abnormality, a signal indicating that the abnormality has occurred is transmitted to the display device 11, the display device 11 performs display indicating that the abnormality has occurred, and the measurement is ended.

In step S008, 1 is added to a correct measurement number of times $n_C$ which is the cumulative number of correct measurements, and the processing proceeds to step S009.

In step S009, it is determined whether the correct measurement number of times $n_C$ has reached the correct measurement specified number of times $n_{CC}$. If the correct measurement number of times $n_C$ has not reached the correct measurement specified number of times $n_{CC}$, the capacitor capacitance measurement is continued (returns to step S002). If the correct measurement number of times $n_C$ has reached the correct measurement specified number of times $n_{CC}$, the processing proceeds to step S010.

As for calculation of the above correct measurement number of times $n_C$, the example in which 1 is added if the measurement is correct has been described, but the correct measurement number of times $n_C$ may be the cumulative number of consecutive correct measurements.

In step S010, as a result of measurement being carried out the number of times equal to the correct measurement specified number of times $n_{CC}$, the median of the capacitor capacitances $C_0$, the number of which is equal to the correct measurement specified number of times $n_{CC}$, is calculated, and is set as a correct capacitor capacitance $C_F$, and the processing proceeds to step S011.

As for calculation of the above correct capacitor capacitance $C_F$, the example of calculation of the median of the capacitor capacitances $C_0$ has been described, but the average thereof may be calculated as the correct capacitor capacitance $C_F$.

In step S011, the correct capacitor capacitance $C_F$ and the capacitor capacitance threshold $C_{CS}$ are compared with each other. If the correct capacitor capacitance $C_F$ is equal to or larger than the capacitor capacitance threshold $C_{CS}$, it is determined that the capacitor capacitance is not insufficient, and the processing proceeds to step S012. If the correct capacitor capacitance $C_F$ is less than the capacitor capacitance threshold $C_{CS}$, the processing proceeds to step S013.

In step S013, 1 is added to a capacitance insufficiency number of times $n_U$ which is the number of consecutive times the correct capacitor capacitance $C_F$ is less than capacitor capacitance threshold $C_{CS}$, and the processing proceeds to step S014.

In step S014, it is determined whether the capacitance insufficiency number of times $n_U$ has reached the capacitance insufficiency specified number of times $n_{CU}$. If the capacitance insufficiency number of times $n_U$ has reached the capacitance insufficiency specified number of times $n_{CU}$, it is determined that a warning that the capacitor capacitance is insufficient is needed, and the processing proceeds to step S015. If the capacitance insufficiency number of times $n_U$ has not reached the capacitance insufficiency specified number of times $n_{CU}$, the capacitor capacitance measurement is continued (returns to step S002).

As for calculation of the above capacitance insufficiency number of times $n_U$, the example in which the number of times of being consecutively less than capacitor capacitance threshold $C_{CS}$ is summed up has been described, but the capacitance insufficiency number of times $n_U$ may be a cumulative total of times that are not consecutive. Alternatively, the capacitance insufficiency number of times $n_U$ may be a cumulative total calculated such that 1 is added if the correct capacitor capacitance $C_F$ is less than capacitor capacitance threshold $C_{CS}$, and 1 is subtracted if the correct capacitor capacitance $C_F$ is equal to or larger than capacitor capacitance threshold $C_{CS}$.

In step S015, the correct capacitor capacitance $C_F$ and a signal for warning about capacitor capacitance insufficiency are transmitted to the display device 11. The display device 11 displays the correct capacitor capacitance $C_F$ and a warning that the capacitor capacitance is insufficient, and the measurement is ended.

On the other hand, if it is determined in step S011 that the capacitor capacitance is not insufficient, 0 is set as the capacitance insufficiency number of times $n_U$ in step S012 for resetting the number of times, and the capacitor capacitance measurement is continued (returns to step S002).

In the present embodiment, the abnormality determination unit or the correct capacitor capacitance calculation unit may be omitted. In the case where the correct capacitor capacitance calculation unit is omitted, in step S011, the value of the correct capacitor capacitance $C_F$ is the value of the capacitor capacitance $C_0$.

As described above, in the present embodiment, the correct capacitor capacitance calculation unit which calculates a correct capacitor capacitance, the abnormality determination unit which determines an abnormality, the capacitor capacitance insufficiency determination unit which determines whether a warning about capacitor capacitance insufficiency is needed, and the display device which displays the results of the above are provided in the capacitor capacitance measurement device. Owing to these components, when capacitor measurement is merely periodically carried out, a warning that the capacitor capacitance is insufficient is displayed, and thus capacitor replacement time can be assuredly determined.

Embodiment 6

In Embodiment 6, a vacuum circuit breaker (VCB) will be described as an example of a power apparatus including any of the capacitor capacitance measurement devices described in Embodiments 1 to 5.

Figure 12:
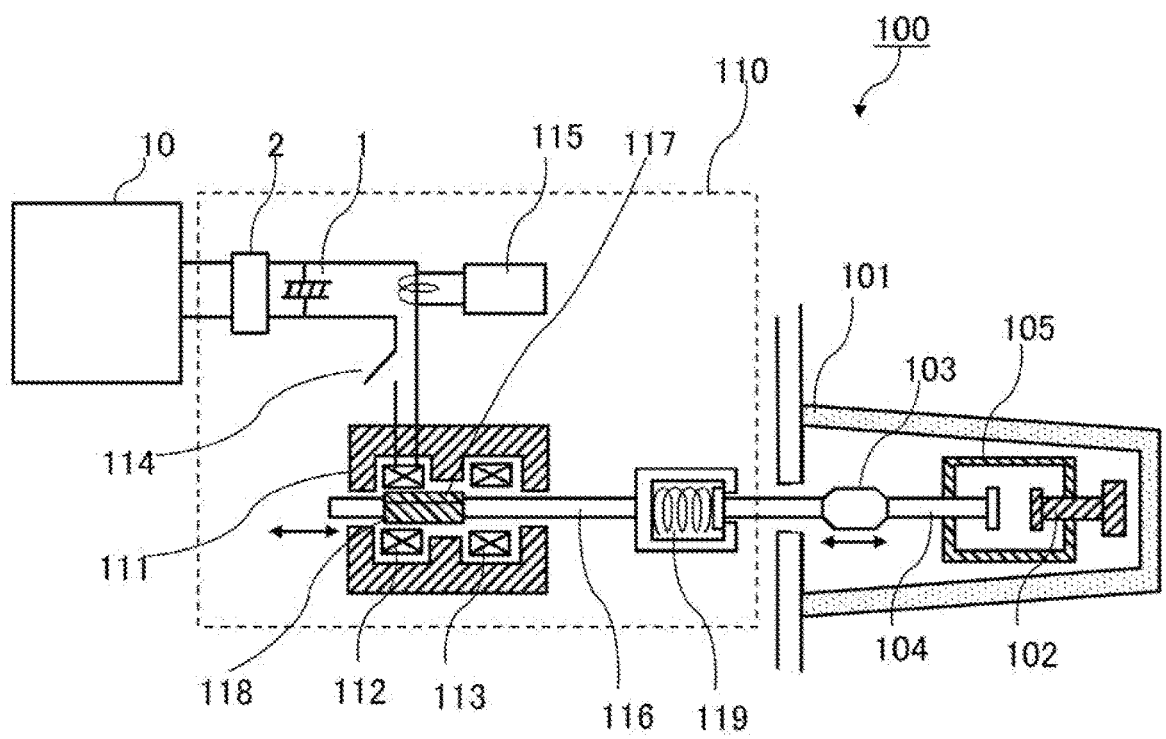
FIG. 12 is a configuration diagram schematically showing a power apparatus including a capacitor capacitance measurement device according to Embodiment 6 of the present invention.

FIG. 12 is a configuration diagram schematically showing a vacuum circuit breaker 100 that includes a capacitor capacitance measurement device and that is the power apparatus according to Embodiment 6. In the vacuum circuit breaker 100, an electromagnetic operation mechanism is operated by energy stored in a capacitor 1.

In FIG. 12, the vacuum circuit breaker 100 includes a vacuum switching tube (VST) 105 which is provided within a tank shielding wall 101 and in which a fixed contact 102 and a movable contact 104 attached to a movable shaft 103 are opened and closed, a fixed core 111 which is provided outside the tank shielding wall 101, a trip coil 112 and a closing coil 113 which are provided within the fixed core 111, the capacitor 1 which is provided outside the tank shielding wall 101 and which supplies power to the trip coil 112, a current transformer (CT) 115 which is provided outside the tank shielding wall 101 and which measures a current when the trip coil 112 is energized from the capacitor 1 by turning on a switch 114, a movable shaft 116 which is provided outside the tank shielding wall 101 so as to penetrate these coils 112 and 113, a permanent magnet 117 and a movable core 118 which are provided outside the tank shielding wall 101 and which are attached to the movable shaft 116, an electromagnetic operation mechanism 110 which is provided outside the tank shielding wall 101 and which has a function of opening and closing the contacts 102 and 104 of the vacuum switching tube 105 by a contact-pressure spring 119 attached to the movable shaft 116, a charging circuit 2 which is provided outside the tank shielding wall 101 and which charges the capacitor 1, and a capacitor capacitance measurement device 10 which is provided outside the tank shielding wall 101 and which measures the capacitance of the capacitor 1. The configuration of the capacitor capacitance measurement device 10 is as described in Embodiments 1 to 5, and the description thereof is omitted here.

Next, the principle of operation of the vacuum circuit breaker according to Embodiment 6 will be described with reference to FIG. 12. Opening/closing operation of the vacuum circuit breaker 100 is performed by electromagnetic force generated by the electromagnetic coils 112 and 113 of the electromagnetic operation mechanism 110, and the opened/closed state of the vacuum circuit breaker 100 is maintained by the magnetic force of the permanent magnet 117. The trip coil 112 and the closing coil 113, which are electromagnetic coils, are provided in the fixed core 111, and the movable shaft 116, to which the movable core 118 and the permanent magnet 117 are attached, is set such that the movable shaft 116 is movable between the trip coil 112 and the closing coil 113. The movable shaft 116 is connected via the contact-pressure spring 119 to the movable shaft 103, at the vacuum switching tube 105 side, which is connected to the movable contact 104 facing the fixed contact 102 of the vacuum switching tube 105.

In a closed state of the vacuum switching tube 105, the movable core 118 is attracted and held at the closed side of the fixed core 111 by the permanent magnet 117. In order to bring the vacuum switching tube 105 into an opened state, the trip coil 112 is energized from the capacitor 1 by a trip command, whereby the movable core 118 is attracted to the opening side by the magnetic force generated due to the energization, and the movable core 118 is attracted and held at the opening side by the permanent magnet 117 even after the energization of the trip coil 112 is stopped. Accordingly, the movable shaft 116, to which the movable core 118 is attached, moves, and the contacts of the vacuum switching tube 105 come into an opened state. When the closing coil 113 is energized, the vacuum switching tube 105 is brought into a closed state through reverse operation.

The capacitance of the capacitor 1, which energizes the trip coil 112, is periodically measured by the capacitor capacitance measurement device 10 described above in Embodiments 1 to 4, and the reliability of the capacitor 1 is maintained. Furthermore, presence/absence of abnormality occurrence during capacitor capacitance measurement can be determined, and it is possible to determine whether the capacitor capacitance calculated in this period is correct. Accordingly, the accuracy of calculation of the capacitor capacitance improves, so that there is an effect of eliminating replacement of the capacitor that occurs since it is falsely determined that the capacitor capacitance is insufficient although replacement of the capacitor is actually unnecessary.

In order to monitor the current applied by the capacitor 1, the current is measured by the current transformer 115. Operation of the capacitor capacitance measurement device 10 has been described in Embodiments 1 to 5, and thus the description thereof is omitted.

In the vacuum circuit breaker 100, for example, a voltage drop value $\Delta V$ due to discharge at the time of capacitance measurement is set such that the capacitor 1 does not interfere with electromagnetic operation drive. For example, in Embodiment 6, with a DC voltage of 77.5 V, it is possible to measure the capacitor capacitance if the voltage drop value due to discharge is 1 V. Therefore, a conduction time T for the discharge switch is determined such that a voltage drop falls within the range of the voltage drop value $\Delta V$ due to discharge required for capacitor capacitance measurement, and, when the conduction time T is a discharge switch conduction time of 200 ms described above in Embodiments 1 to 4, a voltage drop sufficiently falls within the range of the voltage drop value $\Delta V$.

As described above, in the vacuum circuit breaker which is the power apparatus according to Embodiment 6 of the present invention including the capacitor capacitance measurement device, the capacitance of the driving capacitor can be periodically measured also during operation of the vacuum circuit breaker without detaching the capacitor, and determination as to suitability of the capacitance and false determination as to suitability of the capacitance due to occurrence of an abnormality such as noise during capacitance measurement can be checked. Thus, there is a remarkable effect that the reliability of the power apparatus can be improved over a long period of time.

In the above embodiment, the case of application to measurement of the capacitance of the driving capacitor of the vacuum circuit breaker as the power apparatus, has been described, but application to another power apparatus is possible as long as the power apparatus is an apparatus using a capacitor for driving energy. In addition, it is also possible to improve the reliability by application to a capacitor for a vehicle such as an automobile and measurement of the capacitance of the capacitor during operation.

In the above embodiments, the case where the capacitor is charged to the rated voltage thereof has been described. However, in the case where the capacitor is operated at a voltage lower than the rated voltage, the rated voltage may be replaced with an operating voltage.

It is noted that, within the scope of the present invention, the components described in the above embodiments may be freely combined with each other, or any components described in the above embodiments may be modified or simplified as appropriate.

DESCRIPTION OF THE REFERENCE CHARACTERS 1 capacitor
2 charging circuit
3 discharge switch
4 discharge resistor
5 discharge circuit
6 first resistor
7 second resistor
8 resistor voltage dividing circuit
9 control device
10 capacitor capacitance measurement device
11 display device
91 processor
92 memory
93 input/output device
94 data bus
100 vacuum circuit breaker
101 tank shielding wall
102 fixed contact
103 movable shaft
104 movable contact
105 vacuum switching tube
110 electromagnetic operation mechanism
111 fixed core
112 trip coil
113 closing coil
114 switch
115 current transformer
116 movable shaft
117 permanent magnet
118 movable core
119 contact-pressure spring
901 capacitor capacitance calculation unit
902 signal command unit
903 measurement correct/false determination unit
910 abnormality determination unit
911 correct capacitor capacitance calculation unit
912 capacitor capacitance insufficiency determination unit
A voltage division point
C capacitor capacitance
i discharge current
Q electric charge
$R_1$ resistance value of first resistor
$R_2$ resistance value of second resistor
$R_d$ resistance value of discharge resistor
$V_a$ voltage at voltage division point
T capacitor charging stop period (discharge time)
$V_c$ capacitor voltage
$V_c^*$ average capacitor voltage
$\Delta V_c$, $\Delta V_{ca}$, $\Delta V_{cb}$, $\Delta V_{cc}$, $\Delta V_x$, $\Delta V_y$ gradient of capacitor voltage drop

The invention claimed is:

1. A capacitor capacitance measurement device comprising:
a discharge circuit connected in parallel to a capacitor and configured by a discharge resistor and a discharge switch connected in series;
a resistor voltage dividing circuit connected in parallel to the capacitor and configured by a first resistor and a second resistor connected in series; and
a control device for discharging energy stored in the capacitor, by stopping charging of the capacitor and conducting the discharge switch, measuring a voltage at a voltage division point of the resistor voltage dividing circuit, and calculating a capacitor capacitance from the voltage at the voltage division point, wherein
the capacitor is discharged for a predetermined time within a time taken until a voltage value of the capacitor which drops due to discharge of the energy stored in the capacitor reaches a predetermined value,
a capacitor voltage calculated from the voltage, at the voltage division point of the resistor voltage dividing circuit, measured within the predetermined time is set as a measurement capacitor voltage, and
a difference in the measurement capacitor voltage between measurement times within the predetermined time is compared with a preset threshold, and it is determined whether a value of the capacitor capacitance calculated by the control device is correct.

2. The capacitor capacitance measurement device according to claim 1, wherein an accumulated value of an absolute value of the difference in the measurement capacitor voltage between the measurement times within the predetermined time is compared with a preset threshold, and it is determined whether the value of the capacitor capacitance calculated by the control device is correct.

3. The capacitor capacitance measurement device according to claim 1, further comprising a correct capacitor capacitance calculator, as a result of determining whether the value of the capacitor capacitance calculated by the control device is correct, if the value is correct, to calculate a correct capacitor capacitance by a median or an average of a plurality of values of the capacitor capacitance determined to be correct.

4. The capacitor capacitance measurement device according to claim 3, further comprising a capacitor capacitance insufficiency determination unit for, when a capacitance insufficiency number of times in which the correct capacitor capacitance calculated by the control device is less than a preset capacitor capacitance threshold reaches a preset capacitance insufficiency specified number of times, determining that a warning that the capacitor capacitance is insufficient is needed.

5. The capacitor capacitance measurement device according to claim 1, wherein
a false measurement number of times is set such that, as a result of determining whether the value of the capacitor capacitance calculated by the control device is correct, a set value is added if the value is not correct and a set value is subtracted if the value is correct, and
the capacitor capacitance measurement device further comprises an abnormality determiner to determine that there is an abnormality, when the false measurement number of times reaches a preset false measurement specified number of times.

6. A power apparatus comprising:
the capacitor capacitance measurement device according to claim 1; and
an electron agnetic operation mechanism operated by the energy stored in the capacitor.

7. The power apparatus according to claim 6, wherein the predetermined time for which the capacitor is discharged is set to be within a time taken until a voltage of the capacitor which drops due to the discharge reaches a predetermined value, and the predetermined value is a voltage value which is set such that the electromagnetic operation mechanism can be operated when the voltage of the capacitor is equal to or larger than the voltage value.

8. A capacitor capacitance measurement device comprising:
a discharge circuit connected in parallel to a capacitor and configured by a discharge resistor and a discharge switch connected in series;
a resistor voltage dividing circuit connected in parallel to the capacitor and configured by a first resistor and a second resistor connected in series; and
a control device for discharging energy stored in the capacitor, by stopping charging of the capacitor and conducting the discharge switch, measuring a voltage at a voltage division point of the resistor voltage dividing circuit, and calculating a capacitor capacitance from the voltage at the voltage division point, wherein
the capacitor is discharged for a predetermined time within a time taken until a voltage value of the capacitor which drops due to discharge of the energy stored in the capacitor reaches a predetermined value,
a capacitor voltage calculated from the voltage, at the voltage division point of the resistor voltage dividing circuit, measured within the predetermined time is set as a measurement capacitor voltage,
a straight line indicating a gradient of a fall in capacitor voltage is calculated by using an average, in the predetermined time, of the voltage at the voltage division point of the resistor voltage dividing circuit measured within the predetermined time, and
an absolute value of a difference between the measurement capacitor voltage and a capacitor voltage on the straight line at the same time is compared with a preset threshold, and it is determined whether a value of the capacitor capacitance calculated by the control device is correct.

9. The capacitor capacitance measurement device according to claim 8, wherein the absolute value of the difference between the measurement capacitor voltage and the capacitor voltage on the straight line at the same time is accumulated in the predetermined time, an accumulated value of the absolute value is compared with a preset threshold, and it is determined whether the value of the capacitor capacitance calculated by the control device is correct.

10. The capacitor capacitance measurement device according to claim 8, further comprising a correct capacitor capacitance calculator, as a result of determining whether the value of the capacitor capacitance calculated by the control device is correct, if the value is correct, to calculate a correct capacitor capacitance by a median or an average of a plurality of values of the capacitor capacitance determined to be correct.

11. The capacitor capacitance measurement device according to claim 10, further comprising a capacitor capacitance insufficiency determination unit for, when a capacitance insufficiency number of times in which the correct capacitor capacitance calculated by the control device is less than a preset capacitor capacitance threshold reaches a preset capacitance insufficiency specified number of times, determining that a warning that the capacitor capacitance is insufficient is needed.

12. The capacitor capacitance measurement device according to claim 8, wherein
a false measurement number of times is set such that, as a result of determining whether the value of the capacitor capacitance calculated by the control device is correct, a set value is added if the value is not correct and a set value is subtracted if the value is correct, and
the capacitor capacitance measurement device further comprises an abnormality determiner to determine that there is an abnormality, when the false measurement number of times reaches a preset false measurement specified number of times.

13. A power apparatus comprising:
the capacitor capacitance measurement device according to claim 8; and
an electromagnetic operation mechanism operated by the energy stored in the capacitor.

14. The power apparatus according to claim 13, wherein the predetermined time for which the capacitor is discharged is set to be within a time taken until a voltage of the capacitor which drops due to the discharge reaches a predetermined value, and the predetermined value is a voltage value which is set such that the electromagnetic operation mechanism can be operated when the voltage of the capacitor is equal to or larger than the voltage value.

* * * * *